United States Patent
You et al.

(10) Patent No.: US 11,094,588 B2
(45) Date of Patent: Aug. 17, 2021

(54) INTERCONNECTION STRUCTURE OF SELECTIVE DEPOSITION PROCESS

(71) Applicant: Applied Materials, Inc., Santa Clara, CA (US)

(72) Inventors: Shi You, San Jose, CA (US); He Ren, San Jose, CA (US); Mehul B. Naik, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 35 days.

(21) Appl. No.: 16/562,091

(22) Filed: Sep. 5, 2019

(65) Prior Publication Data

US 2021/0074583 A1    Mar. 11, 2021

(51) Int. Cl.
| | | |
|---|---|---|
| *H01L 21/768* | (2006.01) | |
| *H01L 23/522* | (2006.01) | |
| *H01L 23/532* | (2006.01) | |
| *H01L 21/285* | (2006.01) | |

(52) U.S. Cl.
CPC .. *H01L 21/76879* (2013.01); *H01L 21/76831* (2013.01); *H01L 23/5226* (2013.01); *H01L 23/53228* (2013.01); *H01L 21/28562* (2013.01); *H01L 21/28568* (2013.01); *H01L 23/53214* (2013.01); *H01L 23/53257* (2013.01)

(58) Field of Classification Search
CPC combination set(s) only.
See application file for complete search history.

(56) References Cited

U.S. PATENT DOCUMENTS

| | | | |
|---|---|---|---|
| 9,704,784 B1 * | 7/2017 | Lagouge | H01L 21/32134 |
| 9,935,047 B2 * | 4/2018 | Lii | H01L 24/05 |
| 2002/0170891 A1 | 11/2002 | Boyle et al. | |
| 2003/0186539 A1 | 10/2003 | Lee et al. | |
| 2006/0003486 A1 | 1/2006 | Lai et al. | |
| 2013/0320544 A1 | 12/2013 | Lin et al. | |
| 2014/0015122 A1 * | 1/2014 | Chou | H01L 23/3192 257/737 |
| 2015/0102461 A1 * | 4/2015 | Lee | H01L 23/5223 257/532 |
| 2015/0170961 A1 | 6/2015 | Romero et al. | |
| 2015/0217330 A1 | 8/2015 | Haukka et al. | |
| 2017/0005000 A1 * | 1/2017 | Beyne | H01L 21/0212 |
| 2017/0053864 A1 * | 2/2017 | Peng | H01L 21/76844 |
| 2017/0069527 A1 | 3/2017 | Haukka et al. | |

(Continued)

FOREIGN PATENT DOCUMENTS

KR    20070068920 A    7/2007

OTHER PUBLICATIONS

International Search Report and Written Opinion for PCT/US2020/049191 dated Dec. 18, 2020.

*Primary Examiner* — Mamadou L Diallo
(74) *Attorney, Agent, or Firm* — Patterson + Sheridan, LLP

(57) ABSTRACT

Embodiments of the present disclosure generally relate an interconnect structure formed on a substrate and a method of forming the interconnect structure thereon. In one embodiment, a method of forming an interconnect structure includes forming an opening comprising a via and a trench in an insulating structure formed on a substrate, forming a first passivation layer in the opening, removing a portion of the first passivation layer from the opening, and selectively depositing a first metal containing material in the via.

20 Claims, 7 Drawing Sheets

(56) References Cited

U.S. PATENT DOCUMENTS

| | | |
|---|---|---|
| 2017/0110368 A1 | 4/2017 | Yu et al. |
| 2018/0130707 A1* | 5/2018 | Clendenning ..... H01L 21/28556 |
| 2018/0211911 A1 | 7/2018 | Wu et al. |
| 2018/0315650 A1 | 11/2018 | Ren et al. |
| 2018/0315700 A1 | 11/2018 | Boyanov |
| 2019/0148224 A1* | 5/2019 | Kuroda ............. H01L 21/76847 438/653 |
| 2019/0189510 A1 | 6/2019 | Lin et al. |

* cited by examiner

INTERCONNECTION STRUCTURE OF SELECTIVE DEPOSITION PROCESS

BACKGROUND

Field

Embodiments of the present disclosure generally relate to a method of forming an interconnection structure for semiconductor applications.

Description of the Related Art

Reliably producing sub-100 nm and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success, and to the continued effort to increase circuit density and quality of individual substrate and die.

As the dimensions of the integrated circuit components are reduced (e.g., to sub-micron dimensions), the materials used to fabricate such components must be carefully selected in order to obtain satisfactory levels of electrical performance. Typically, the metal interconnects are electrically isolated from each other by a dielectric bulk insulating material. When the distance between adjacent metal interconnects and/or the thickness of the dielectric bulk insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit.

Some integrated circuit components include multilevel interconnect structures (e.g., dual damascene structures). Typically, dual damascene structures have dielectric bulk insulating layers and conductive layers, such as copper, stacked on top of one another. Vias and/or trenches are etched into the dielectric bulk insulating layer and conductive layers are subsequently filled into the vias and/or trenches and polished back using a process such as chemical mechanical planarization (CMP), so the conducting materials are only left in the vias and/or trenches. In the dual damascene approach, both vias and trenches are patterned into a layer of dielectric material or a stack of different dielectric materials before copper.

However, while forming the conductive layers in the dual damascene structures, the conductive layers as formed during the deposition process may result in a relatively high via resistance due to interface contact among the conductive layers, barrier layers and the nearby bulk dielectric insulating layers. High via resistance may eventually deteriorate the electrical performance of the semiconductor devices.

Furthermore, poor or irregular growth of the conductive layer in the interconnection structure may also result in undesired high contact resistance, thereby resulting in undesirably poor electrical properties of the device. In addition, poor nucleation of the metal elements in the back end interconnection may impact not only the electrical performance of the devices, but also on the integration of the conductive contact material subsequently formed thereon.

Thus, there is a need for methods for forming interconnects with enhanced electrical performance of the integrated circuits.

SUMMARY

Embodiments of the present disclosure generally relate an interconnect structure formed on a substrate and a method of forming the interconnect structure thereon. In one embodiment, a method of forming an interconnect structure includes forming an opening comprising a via and a trench in an insulating structure formed on a substrate, forming a first passivation layer in the opening, removing a portion of the first passivation layer from the opening, and selectively depositing a first metal containing material in the via.

In another embodiment, a method of forming an interconnect structure includes forming a first passivation layer in an opening formed in an insulating structure on a substrate, wherein the opening comprises a trench formed on a via in the insulating structure, wherein the first passivation layer is an oxide layer, a nitride layer or a methyl group containing layer, selectively depositing a first metal containing material in the via, and forming a second metal containing material in the trench in contact with the first metal containing material.

In yet another embodiment, an interconnect structure includes a insulating structure formed on a substrate having an opening comprising a via and a trench formed therein, a passivation layer formed on a sidewall of the opening, wherein the passivation layer is an oxide layer, a nitride layer or a methyl group containing layer, a first metal containing material formed in the via, and a second metal containing material formed in the trench, wherein the first metal containing material is different from the second metal containing material.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

An interconnection structure and method for forming the same utilizing a selective deposition of the conductive materials at desired locations in an insulating structure in a semiconductor device are provided. A passivation protection may be utilized along with a selective deposition of a metal conductive material in an interconnection structure to enhance the deposition of the metal conductive materials at the desired and selected locations. Multiple depositions and etching process may be utilized to form the interconnection structures with desired materials at different locations of the interconnection structure.

Figure 1:
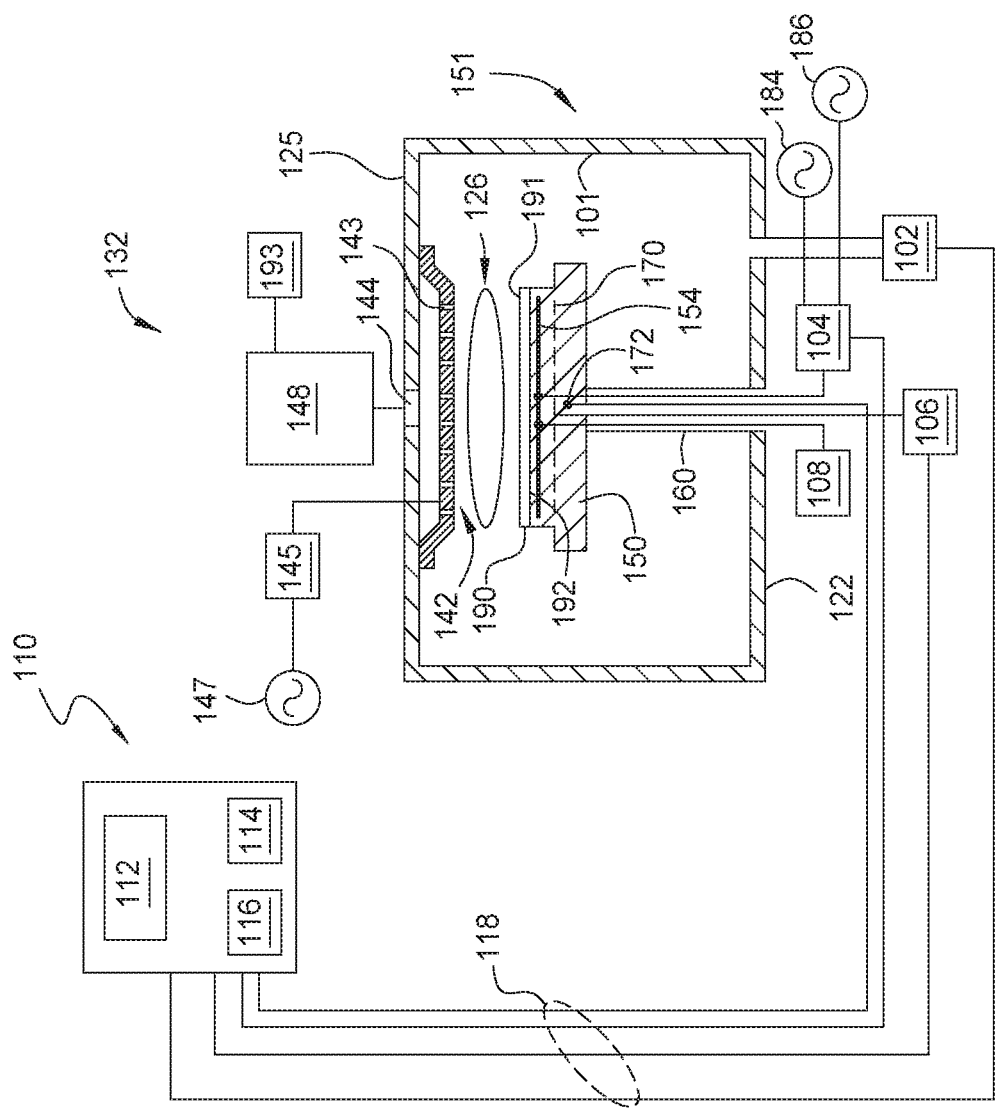
FIG. 1 depicts an apparatus utilized to form a dielectric material on a substrate in accordance with one embodiment of the present disclosure.

FIG. 1 is a cross sectional view of a plasma processing chamber 132 suitable for performing a plasma deposition process (e.g., a plasma enhanced CVD or a metal organic CVD) that may be utilized as semiconductor interconnection structures for semiconductor devices manufacture. The processing chamber 132 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 132 includes a chamber body 151. The chamber body 151 includes a lid 125, a sidewall 101 and a bottom wall 122 that define an interior volume 126.

A substrate support pedestal 150 is provided in the interior volume 126 of the chamber body 151. The pedestal 150 may be fabricated from aluminum, ceramic, aluminum nitride, and other suitable materials. In one embodiment, the pedestal 150 is fabricated by a ceramic material, such as aluminum nitride, which is a material suitable for use in a high temperature environment, such as a plasma process environment, without causing thermal damage to the pedestal 150. The pedestal 150 may be moved in a vertical direction inside the chamber body 151 using a lift mechanism (not shown).

The pedestal 150 may include an embedded heater element 170 suitable for controlling the temperature of a substrate 190 supported on the pedestal 150. In one embodiment, the pedestal 150 may be resistively heated by applying an electric current from a power supply 106 to the heater element 170. In one embodiment, the heater element 170 may be made of a nickel-chromium wire encapsulated in a nickel-iron-chromium alloy (e.g., INCOLOY®) sheath tube. The electric current supplied from the power supply 106 is regulated by the controller 110 to control the heat generated by the heater element 170, thus maintaining the substrate 190 and the pedestal 150 at a substantially constant temperature during film deposition at any suitable temperature range. In another embodiment, the pedestal may be maintained at room temperature as needed. In yet another embodiment, the pedestal 150 may also include a chiller (not shown) as needed to cool the pedestal 150 at a range lower than room temperature as needed. The supplied electric current may be adjusted to selectively control the temperature of the pedestal 150 between about 100 degrees Celsius to about 700 degrees Celsius.

A temperature sensor 172, such as a thermocouple, may be embedded in the substrate support pedestal 150 to monitor the temperature of the pedestal 150 in a conventional manner. The measured temperature is used by the controller 110 to control the power supplied to the heater element 170 to maintain the substrate at a desired temperature.

The pedestal 150 generally includes a plurality of lift pins (not shown) disposed therethrough that are configured to lift the substrate 190 from the pedestal 150 and facilitate exchange of the substrate 190 with a robot (not shown) in a conventional manner.

The pedestal 150 comprises at least one electrode 192 for retaining the substrate 190 on the pedestal 150. The electrode 192 is driven by a chucking power source 108 to develop an electrostatic force that holds the substrate 190 to the pedestal surface, as is conventionally known. Alternatively, the substrate 190 may be retained to the pedestal 150 by clamping, vacuum or gravity.

In one embodiment, the pedestal 150 is configured as a cathode having the electrode 192 embedded therein coupled to at least one RF bias power source, shown in FIG. 1 as two RF bias power sources 184, 186. Although the example depicted in FIG. 1 shows two RF bias power sources, 184, 186, it is noted that the number of the RF bias power sources may be any number as needed. The RF bias power sources 184, 186 are coupled between the electrode 192 disposed in the pedestal 150 and another electrode, such as a gas distribution plate 142 or lid 125 of the processing chamber 132. The RF bias power source 184, 186 excites and sustains a plasma discharge formed from the gases disposed in the processing region of the processing chamber 132.

In the embodiment depicted in FIG. 1, the dual RF bias power sources 184, 186 are coupled to the electrode 192 disposed in the pedestal 150 through a matching circuit 104. The signal generated by the RF bias power source 184, 186 is delivered through matching circuit 104 to the pedestal 150 through a single feed to ionize the gas mixture provided in the plasma processing chamber 132, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts.

A vacuum pump 102 is coupled to a port formed in the bottom 122 of the chamber body 151. The vacuum pump 102 is used to maintain a desired gas pressure in the chamber body 151. The vacuum pump 102 also evacuates post-processing gases and by-products of the process from the chamber body 151.

The processing chamber 132 includes one or more gas delivery passages 144 coupled through the lid 125 of the processing chamber 132. The gas delivery passages 144 and the vacuum pump 102 are positioned at opposite ends of the processing chamber 132 to induce laminar flow within the interior volume 126 to minimize particulate contamination.

The gas delivery passage 144 is coupled to the gas panel 193 through a remote plasma source (RPS) 148 to provide a gas mixture into the interior volume 126. In one embodiment, the gas mixture supplied through the gas delivery passage 144 may be further delivered through a gas distribution plate 142 disposed below the gas delivery passage 144. In one example, the gas distribution plate 142 having a plurality of apertures 143 is coupled to the lid 125 of the chamber body 151 above the pedestal 150. The apertures 143 of the gas distribution plate 142 are utilized to introduce process gases from the gas panel 193 into the chamber body 151. The apertures 143 may have different sizes, number, distributions, shape, design, and diameters to facilitate the flow of the various process gases for different process requirements. A plasma is formed from the process gas mixture exiting the gas distribution plate 142 to enhance thermal decomposition of the process gases resulting in the deposition of material on the surface 191 of the substrate 190.

The gas distribution plate 142 and substrate support pedestal 150 may be formed a pair of spaced apart electrodes in the interior volume 126. One or more RF sources 147 provide a bias potential through a matching network 145 to the gas distribution plate 142 to facilitate generation of a plasma between the gas distribution plate 142 and the pedestal 150. Alternatively, the RF sources 147 and matching network 145 may be coupled to the gas distribution plate 142, substrate support pedestal 150, or coupled to both the gas distribution plate 142 and the substrate support pedestal 150, or coupled to an antenna (not shown) disposed exterior to the chamber body 151. In one embodiment, the RF sources 147 may provide between about 10 Watts and about 3000 Watts at a frequency of about 30 kHz to about 13.6 MHz. Alternatively, the RF source 147 may be a microwave generator that provide microwave power to the gas distribution plate 142 that assists generation of the plasma in the interior volume 126.

Examples of gases that may be supplied from the gas panel 193 may include a silicon containing gas, carbon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable examples of the carbon containing gas include $CH_4$, $C_2H_6$, hydrocarbon containing gas, and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like. In one embodiment, the remote plasma source (RPS) 148 may be alternatively coupled to the gas delivery passages 144 to assist in forming a plasma from the gases supplied from the gas panel 193 into the in the interior volume 126. The remote plasma source 148 provides plasma formed from the gas mixture provided by the gas panel 193 to the processing chamber 132.

The controller 110 includes a central processing unit (CPU) 112, a memory 116, and a support circuit 114 utilized to control the process sequence and regulate the gas flows from the gas panel 193. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing chamber 132 are handled through numerous signal cables collectively referred to as signal buses 118, some of which are illustrated in FIG. 1.

Figure 2:
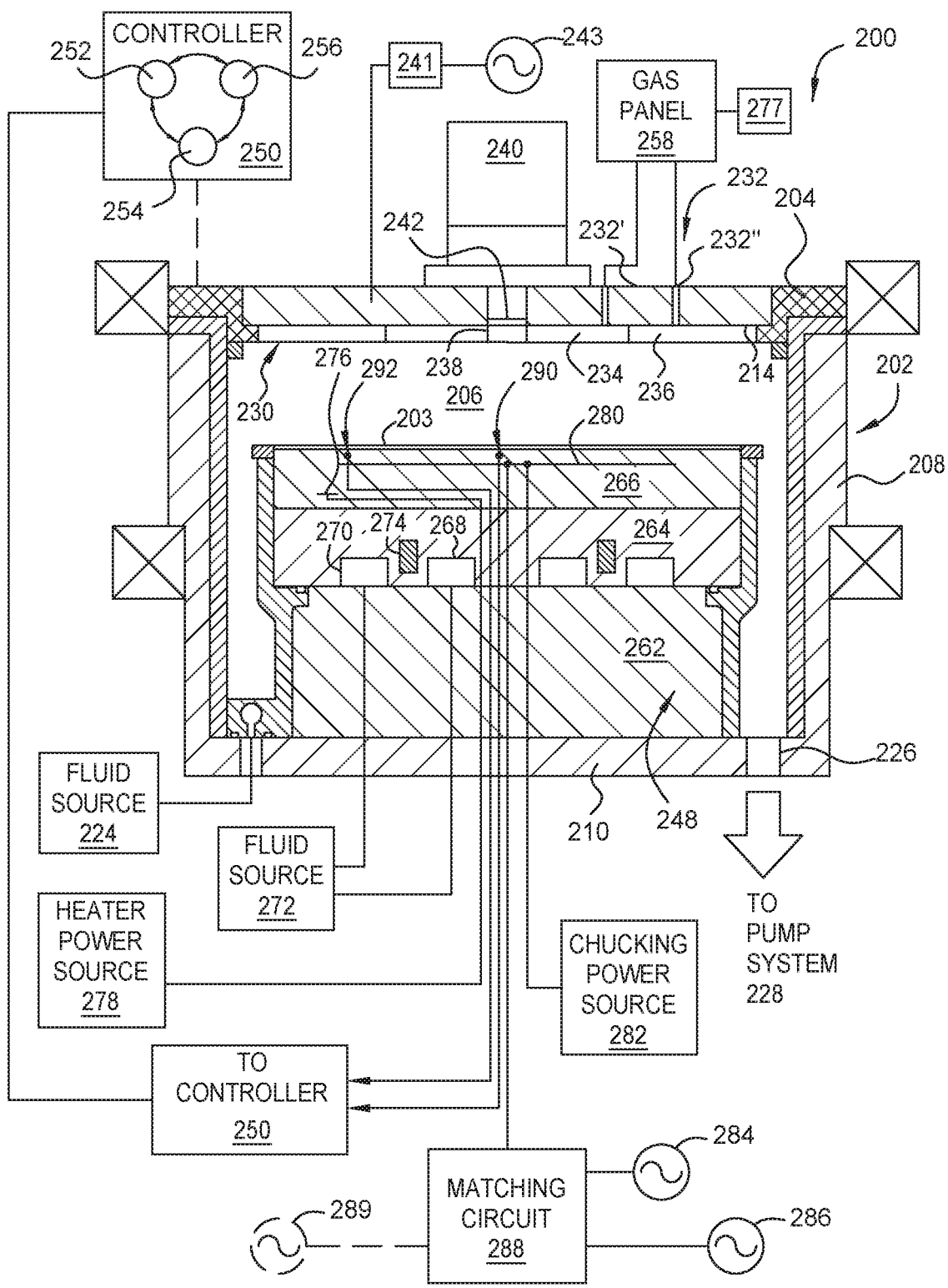
FIG. 2 depicts a processing chamber that may be utilized to perform an etching process in accordance with one embodiment of the present disclosure.

FIG. 2 is a sectional view of one example of a processing chamber 200 suitable for performing a patterning (e.g., etching) process on a substrate. Suitable processing chambers that may be adapted for use with the teachings disclosed herein include, for example, an ENABLER® or SYM3® processing chamber available from Applied Materials, Inc. of Santa Clara, Calif. Although the processing chamber 200 is shown including a plurality of features that enable superior etching/patterning performance, it is contemplated that other processing chambers may be adapted to benefit from one or more of the features disclosed herein.

The processing chamber 200 includes a chamber body 202 and a lid 204 which enclose an interior volume 206. The chamber body 202 is typically fabricated from aluminum, stainless steel or other suitable material. The chamber body 202 generally includes sidewalls 208 and a bottom 210. A substrate support pedestal access port (not shown) is generally defined in a sidewall 208 and a selectively sealed by a slit valve to facilitate entry and egress of a substrate 203 from the processing chamber 200. An exhaust port 226 is defined in the chamber body 202 and couples the interior volume 206 to a pump system 228. The pump system 228 generally includes one or more pumps and throttle valves utilized to evacuate and regulate the pressure of the interior volume 206 of the processing chamber 200. In one implementation, the pump system 228 maintains the pressure inside the interior volume 206 at operating pressures typically between about 10 mTorr to about 500 Torr.

The lid 204 is sealingly supported on the sidewall 208 of the chamber body 202. The lid 204 may be opened to allow access to the interior volume 206 of the processing chamber 200. The lid 204 includes a window 242 that facilitates optical process monitoring. In one implementation, the window 242 is comprised of quartz or other suitable material that is transmissive to a signal utilized by an optical monitoring system 240 mounted outside the processing chamber 200.

The optical monitoring system 240 is positioned to view at least one of the interior volume 206 of the chamber body 202 and/or the substrate 203 positioned on a substrate support pedestal assembly 248 through the window 242. In one embodiment, the optical monitoring system 240 is coupled to the lid 204 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the disclosure is the EyeD® full-spectrum, interferometric metrology module, available from Applied Materials, Inc., of Santa Clara, Calif.

A gas panel 258 is coupled to the processing chamber 200 to provide process and/or cleaning gases to the interior volume 206. In the example depicted in FIG. 2, inlet ports 232', 232" are provided in the lid 204 to allow gases to be delivered from the gas panel 258 to the interior volume 206 of the processing chamber 200. In one implementation, the gas panel 258 is adapted to provide fluorinated process gas through the inlet ports 232', 232" and into the interior volume 206 of the processing chamber 200. In one implementation, the process gas provided from the gas panel 258 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, $CO$, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 230 is coupled to an interior surface 214 of the lid 204. The showerhead assembly 230 includes a plurality of apertures that allow the gases flowing through the showerhead assembly 230 from the inlet ports 232', 232" into the interior volume 206 of the processing chamber 200 in a predefined distribution across the surface of the substrate 203 being processed in the processing chamber 200.

A remote plasma source 277 may be optionally coupled to the gas panel 258 to facilitate dissociating gas mixture from a remote plasma prior to entering into the interior volume 206 for processing. A RF source power 243 is coupled through a matching network 241 to the showerhead assembly 230. The RF source power 243 typically is capable of producing up to about 3000 W at a tunable frequency in a range from about 50 kHz to about 200 MHz.

The showerhead assembly 230 additionally includes a region transmissive to an optical metrology signal. The optically transmissive region or passage 238 is suitable for allowing the optical monitoring system 240 to view the interior volume 206 and/or the substrate 203 positioned on the substrate support pedestal assembly 248. The passage 238 may be a material, an aperture or plurality of apertures formed or disposed in the showerhead assembly 230 that is substantially transmissive to the wavelengths of energy generated by, and reflected back to, the optical monitoring system 240. In one embodiment, the passage 238 includes a window 242 to prevent gas leakage through the passage 238. The window 242 may be a sapphire plate, quartz plate or other suitable material. The window 242 may alternatively be disposed in the lid 204.

In one implementation, the showerhead assembly 230 is configured with a plurality of zones that allow for separate control of gas flowing into the interior volume 206 of the processing chamber 200. In the example illustrated in FIG. 2, the showerhead assembly 230 has an inner zone 234 and an outer zone 236 that are separately coupled to the gas panel 258 through separate inlet ports 232', 232".

The substrate support pedestal assembly 248 is disposed in the interior volume 206 of the processing chamber 200 below the gas distribution (showerhead) assembly 230. The substrate support pedestal assembly 248 holds the substrate 203 during processing. The substrate support pedestal assembly 248 generally includes a plurality of lift pins (not shown) disposed therethrough that are configured to lift the substrate 203 from the substrate support pedestal assembly 248 and facilitate exchange of the substrate 203 with a robot (not shown) in a conventional manner. An inner liner 218 may closely circumscribe the periphery of the substrate support pedestal assembly 248.

In one implementation, the substrate support pedestal assembly 248 includes a mounting plate 262, a base 264 and an electrostatic chuck 266. The mounting plate 262 is coupled to the bottom 210 of the chamber body 202 and includes passages for routing utilities, such as fluids, power lines and sensor leads, among others, to the base 264 and the electrostatic chuck 266. The electrostatic chuck 266 comprises at least one clamping electrode 280 for retaining the substrate 203 below showerhead assembly 230. The electrostatic chuck 266 is driven by a chucking power source 282 to develop an electrostatic force that holds the substrate 203 to the chuck surface, as is conventionally known. Alternatively, the substrate 203 is retained to the substrate support pedestal assembly 248 by clamping, vacuum or gravity.

At least one of the base 264 or electrostatic chuck 266 may include at least one optional embedded heater 276, at least one optional embedded isolator 274 and a plurality of conduits 268, 270 to control the lateral temperature profile of the substrate support pedestal assembly 248. The conduits 268, 270 are fluidly coupled to a fluid source 272 that circulates a temperature regulating fluid therethrough. The heater 276 is regulated by a power source 278. The conduits 268, 270 and heater 276 are utilized to control the temperature of the base 264, thereby heating and/or cooling the electrostatic chuck 266 and ultimately, the temperature profile of the substrate 203 disposed thereon. The temperature of the electrostatic chuck 266 and the base 264 may be monitored using a plurality of temperature sensors 290, 292. The electrostatic chuck 266 may further comprise a plurality of gas passages (not shown), such as grooves, that are formed in a substrate support pedestal supporting surface of the electrostatic chuck 266 and fluidly coupled to a source of a heat transfer (or backside) gas, such as He. In operation, the backside gas is provided at controlled pressure into the gas passages to enhance the heat transfer between the electrostatic chuck 266 and the substrate 203.

In one implementation, the substrate support pedestal assembly 248 is configured as a cathode and includes an electrode 280 that is coupled to a plurality of RF bias power sources 284, 286. The RF bias power sources 284, 286 are coupled between the electrode 280 disposed in the substrate support pedestal assembly 248 and another electrode, such as the showerhead assembly 230 or ceiling (lid 204) of the chamber body 202. The RF bias power excites and sustains a plasma discharge formed from the gases disposed in the processing region of the chamber body 202.

In the example depicted in FIG. 2, the dual RF bias power sources 284, 286 are coupled to the electrode 280 disposed in the substrate support pedestal assembly 248 through a matching circuit 288. The signal generated by the RF bias power sources 284, 286 is delivered through matching circuit 288 to the substrate support pedestal assembly 248 through a single feed to ionize the gas mixture provided in the plasma processing chamber 200, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts. An additional bias power source 289 may be coupled to the electrode 280 to control the characteristics of the plasma.

In one mode of operation, the substrate 203 is disposed on the substrate support pedestal assembly 248 in the plasma processing chamber 200. A process gas and/or gas mixture is introduced into the chamber body 202 through the showerhead assembly 230 from the gas panel 258. A vacuum pump system 228 maintains the pressure inside the chamber body 202 while removing deposition by-products.

A controller 250 is coupled to the processing chamber 200 to control operation of the processing chamber 200. The controller 250 includes a central processing unit (CPU) 252, a memory 254, and a support circuit 256 utilized to control the process sequence and regulate the gas flows from the gas panel 258. The CPU 252 may be any form of general purpose computer processor that may be used in an industrial setting. The software routines can be stored in the memory 254, such as random access memory, read only memory, floppy, or hard disk drive, or other form of digital storage. The support circuit 256 is conventionally coupled to the CPU 252 and may include cache, clock circuits, input/output systems, power supplies, and the like. Bi-directional communications between the controller 250 and the various components of the processing chamber 200 are handled through numerous signal cables.

Figure 3:
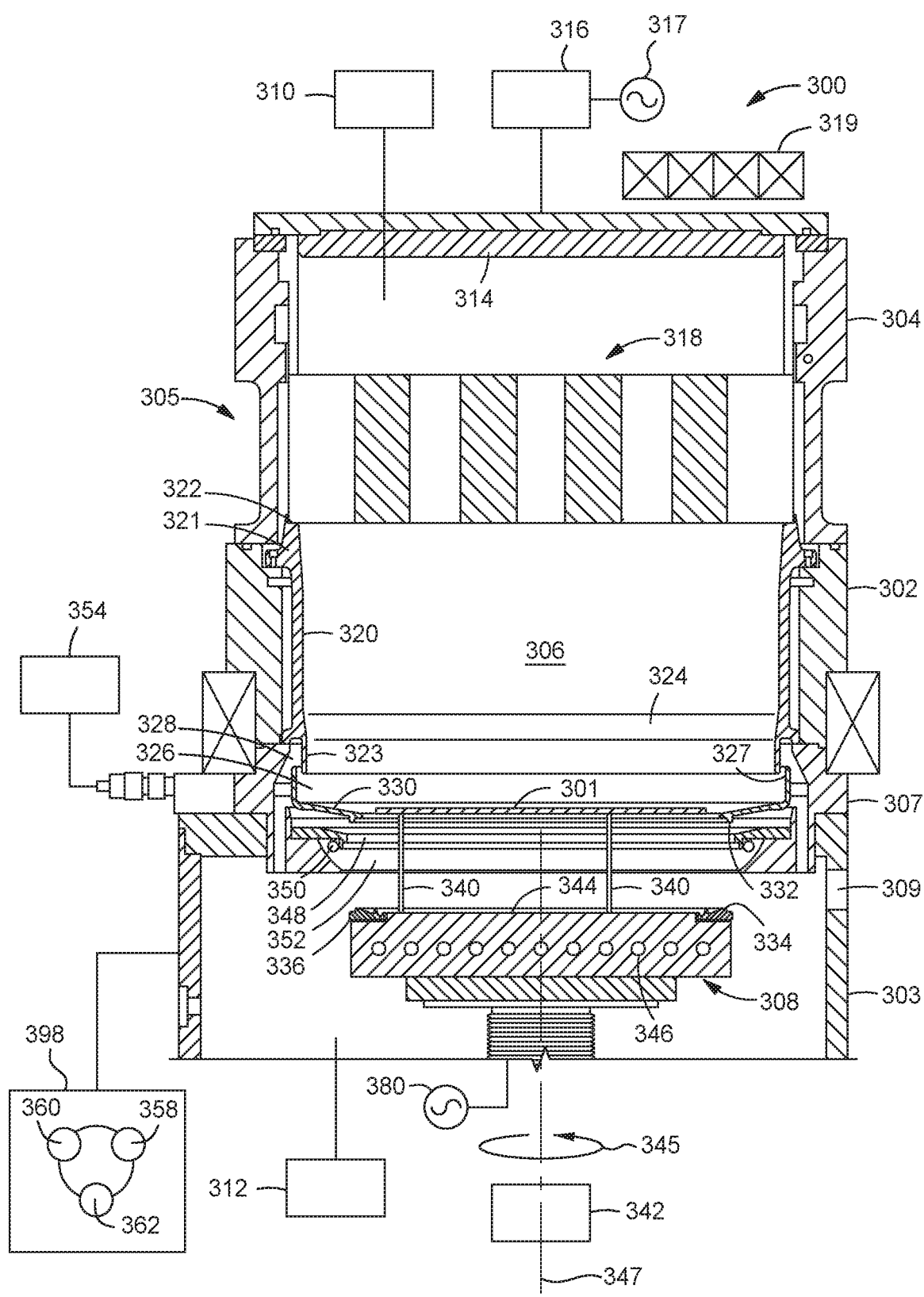
FIG. 3 depicts one embodiment of a deposition chamber for practice one embodiment of the present disclosure.

FIG. 3 illustrates an exemplary physical vapor deposition (PVD) chamber 300 (e.g., a sputter process chamber) suitable for sputter depositing materials, particularly a metal containing material, according to one embodiment of the disclosure. Examples of suitable PVD chambers include the ALPS® Plus and SIP ENCORE® PVD processing chambers, both commercially available from Applied Materials, Inc., Santa Clara, of Calif. It is contemplated that processing chambers available from other manufactures may also be adapted to perform the embodiments described herein.

The deposition chamber 300 has an upper sidewall 302, a lower sidewall 303, and a lid portion 304 defining a body 305 that encloses an interior volume 306 thereof. An adapter plate 307 may be disposed between the upper sidewall 302 and the lower sidewall 303.

A substrate support, such as a pedestal 308, is disposed in the interior volume 306 of the deposition chamber 300. The substrate pedestal 308 may be rotatable, as indicated by the arrow 345, along an axis 347, where a shaft 343 of the substrate pedestal 308 is located. Alternatively, the substrate support pedestal 308 may be lifted up to rotate as necessary during a deposition process.

A substrate transfer port 309 is formed in the lower sidewall 303 for transferring substrates into and out of the interior volume 306.

In one embodiment, the deposition chamber 300 comprises a sputtering chamber, also known as a physical vapor deposition (PVD) chamber, capable of depositing, for example, aluminum, tungsten, cobalt, ruthenium, titanium, aluminum oxide, aluminum, aluminum nitride, scandium doped aluminum nitride, aluminum oxynitride, lead zirconate titanate (PZT), potassium sodium niobate (KNN), lithium niobate, copper, tantalum, tantalum nitride, tantalum oxynitride, titanium oxynitride, or tungsten nitride on a substrate, such as the substrate 301.

A gas source 310 is coupled to the deposition chamber 300 to supply process gases into the interior volume 306. In one embodiment, process gases may include inert gases, non-reactive gases, and reactive gases if necessary. Examples of process gases that may be provided by the gas source 110 include, but not limited to, argon gas (Ar), helium (He), neon gas (Ne), nitrogen gas ($N_2$) and oxygen gas ($O_2$), among others.

A pumping device 312 is coupled to the deposition chamber 300 in communication with the interior volume 306 to control the pressure of the interior volume 306. In one embodiment, the pressure level of the deposition chamber 300 may be maintained at about 1 Torr or less. In another embodiment, the pressure level of the deposition chamber 300 may be maintained at about 500 milliTorr or less. In yet another embodiment, the pressure level of the deposition chamber 300 may be maintained at about 1 milliTorr and about 300 milliTorr.

The lid portion 304 may support a sputtering source 314, such as a target. In one embodiment, the sputtering source 314 may be fabricated from a material containing titanium (Ti), tantalum (Ta), ruthenium (Ru), iridium (Ir), iron (Fe), magnesium (Mg), tungsten (W), cobalt (Co), nickel (Ni), copper (Cu), aluminum (Al), zirconium (Zr), niobium (Nb), scandium (Sc), alloys thereof, combinations thereof, or the like. In an exemplary embodiment depicted herein, the sputtering source 314 may be fabricated by ruthenium (Ru), iridium (Ir), iron (Fe), magnesium (Mg) or cobalt (Co).

The sputtering source 314 may be coupled to a source assembly 316 comprising a power supply 317 for the sputtering source 314. A set of magnet 319 may be coupled adjacent to the sputtering source 314 which enhances efficient sputtering materials from the sputtering source 314 during processing. Examples of the magnetron assembly include an electromagnetic linear magnetron, a serpentine magnetron, a spiral magnetron, a double-digitated magnetron, a rectangularized spiral magnetron, among others.

An additional RF power source 380 may also be coupled to the deposition chamber 300 through the pedestal 308 (or called substrate support) to provide a bias power between the sputtering source 314 and the pedestal 308 as needed. In one embodiment, the RF power source 380 may have a frequency between about 1 MHz and about 100 MHz, such as about 13.56 MHz.

A collimator 318 may be positioned in the interior volume 306 between the sputtering source 314 and the pedestal 308. A shield tube 320 may be in proximity to the collimator 318 and interior of the lid portion 304. The collimator 318 includes a plurality of apertures to direct gas and/or material flux within the interior volume 306. The collimator 318 may be mechanically and electrically coupled to the shield tube 320. In one embodiment, the collimator 318 is mechanically coupled to the shield tube 320, such as by a welding process, making the collimator 318 integral to the shield tube 320. In another embodiment, the collimator 318 may be electrically floating within the chamber 300. In another embodiment, the collimator 318 may be coupled to an electrical power source and/or electrically coupled to the lid portion 304 of the body 305 of the deposition chamber 300.

The shield tube 320 may include a tubular body 321 having a recess 322 formed in an upper surface thereof. The recess 322 provides a mating interface with a lower surface of the collimator 318. The tubular body 321 of the shield tube 320 may include a shoulder region 323 having an inner diameter that is less than the inner diameter of the remainder of the tubular body 321. In one embodiment, the inner surface of the tubular body 321 transitions radially inward along a tapered surface 324 to an inner surface of the shoulder region 323. A shield ring 326 may be disposed in the chamber 300 adjacent to the shield tube 320 and intermediate of the shield tube 320 and the adapter plate 307. The shield ring 326 may be at least partially disposed in a recess 328 formed by an opposing side of the shoulder region 323 of the shield tube 320 and an interior sidewall of the adapter plate 307.

In one aspect, the shield ring 326 includes an axially projecting annular sidewall 327 that includes an inner diameter that is greater than an outer diameter of the shoulder region 323 of the shield tube 320. A radial flange 330 extends from the annular sidewall 327. The radial flange 330 may be formed at an angle greater than about ninety degrees (90°) relative to the inside diameter surface of the annular sidewall 327 of the shield ring 326. The radial flange 330 includes a protrusion 332 formed on a lower surface thereof. The protrusion 332 may be a circular ridge extending from the surface of the radial flange 330 in an orientation that is substantially parallel to the inside diameter surface of the annular sidewall 327 of the shield ring 326. The protrusion 332 is generally adapted to mate with a recessed flange 334 formed in an edge ring 336 disposed on the pedestal 308. The recessed flange 334 may be a circular groove formed in the edge ring 336. The engagement of the protrusion 332 and the recessed flange 334 centers the shield ring 326 with respect to the longitudinal axis of the pedestal 308. The substrate 301 (shown supported on lift pins 340) is centered relative to the longitudinal axis of the pedestal 308 by coordinated positioning calibration between the pedestal 308 and a robot blade (not shown). In this manner, the substrate 301 may be centered within the deposition chamber 300 and the shield ring 326 may be centered radially about the substrate 301 during processing.

In operation, a robot blade (not shown) having a substrate 301 thereon is extended through the substrate transfer port 309. The pedestal 308 may be lowered to allow the substrate 301 to be transferred to the lift pins 340 extending from the pedestal 308. Lifting and lowering of the pedestal 308 and/or the lift pins 340 may be controlled by a drive 342 coupled to the pedestal 308. The substrate 301 may be lowered onto a substrate receiving surface 344 of the pedestal 308. With the substrate 301 positioned on the substrate receiving surface 344 of the pedestal 308, sputter depositions may be performed on the substrate 301. The edge ring 336 may be electrically insulated from the substrate 301 during processing. Therefore, the substrate receiving surface 344 may include a height that is greater than a height of portions of the edge ring 336 adjacent the substrate 301 such that the substrate 301 is prevented from contacting the edge ring 336. During sputter deposition, the temperature of the substrate 301 may be controlled by utilizing thermal control channels 346 disposed in the pedestal 308.

After sputter deposition, the substrate 301 may be elevated utilizing the lift pins 340 to a position that is spaced away from the pedestal 308. The elevated location may be proximate one or both of the shield ring 326 and a reflector ring 348 adjacent to the adapter plate 307. The adapter plate 307 includes one or more lamps 350 coupled thereto intermediate of a lower surface of the reflector ring 348 and a concave surface 352 of the adapter plate 307. The lamps 350 provide optical and/or radiant energy in the visible or near visible wavelengths, such as in the infra-red (IR) and/or ultraviolet (UV) spectrum. The energy from the lamps 350 is focused radially inward toward the backside (i.e., lower surface) of the substrate 301 to heat the substrate 301 and the material deposited thereon. Reflective surfaces on the chamber components surrounding the substrate 301 serve to focus the energy toward the backside of the substrate 301 and away from other chamber components where the energy would be lost and/or not utilized. The adapter plate 307 may be coupled to a coolant source 354 to control the temperature of the adapter plate 307 during heating.

After controlling the substrate 301 to the desired temperature, the substrate 301 is lowered to a position on the substrate receiving surface 344 of the pedestal 308. The substrate 301 may be rapidly cooled utilizing the thermal control channels 346 in the pedestal 308 via conduction. The temperature of the substrate 301 may be ramped down from the first temperature to a second temperature in a matter of seconds to about a minute. The substrate 301 may be removed from the deposition chamber 300 through the substrate transfer port 309 for further processing. The substrate 301 may be maintained at a desired temperature range, such as less than 250 degrees Celsius as needed.

A controller 398 is coupled to the process chamber 300. The controller 398 includes a central processing unit (CPU) 160, a memory 358, and support circuits 362. The controller 398 is utilized to control the process sequence, regulating the gas flows from the gas source 310 into the deposition chamber 300 and controlling ion bombardment of the sputtering source 314. The CPU 360 may be of any form of a general purpose computer processor that can be used in an industrial setting. The software routines can be stored in the memory 358, such as random access memory, read only memory, floppy or hard disk drive, or other form of digital storage. The support circuits 362 are conventionally coupled to the CPU 360 and may comprise cache, clock circuits, input/output subsystems, power supplies, and the like. The software routines, when executed by the CPU 360, transform the CPU into a specific purpose computer (controller) 398 that controls the deposition chamber 300 such that the processes are performed in accordance with the present disclosure. The software routines may also be stored and/or executed by a second controller (not shown) that is located remotely from the chamber 300.

During processing, material is sputtered from the sputtering source 314 and deposited on the surface of the substrate 301. The sputtering source 314 and the substrate support pedestal 308 are biased relative to each other by the power supply 317 or 380 to maintain a plasma formed from the process gases supplied by the gas source 310. The ions from the plasma are accelerated toward and strike the sputtering source 314, causing target material to be dislodged from the sputtering source 314. The dislodged target material and process gases form a metal containing layer on the substrate 301 with a desired composition.

Figure 4:
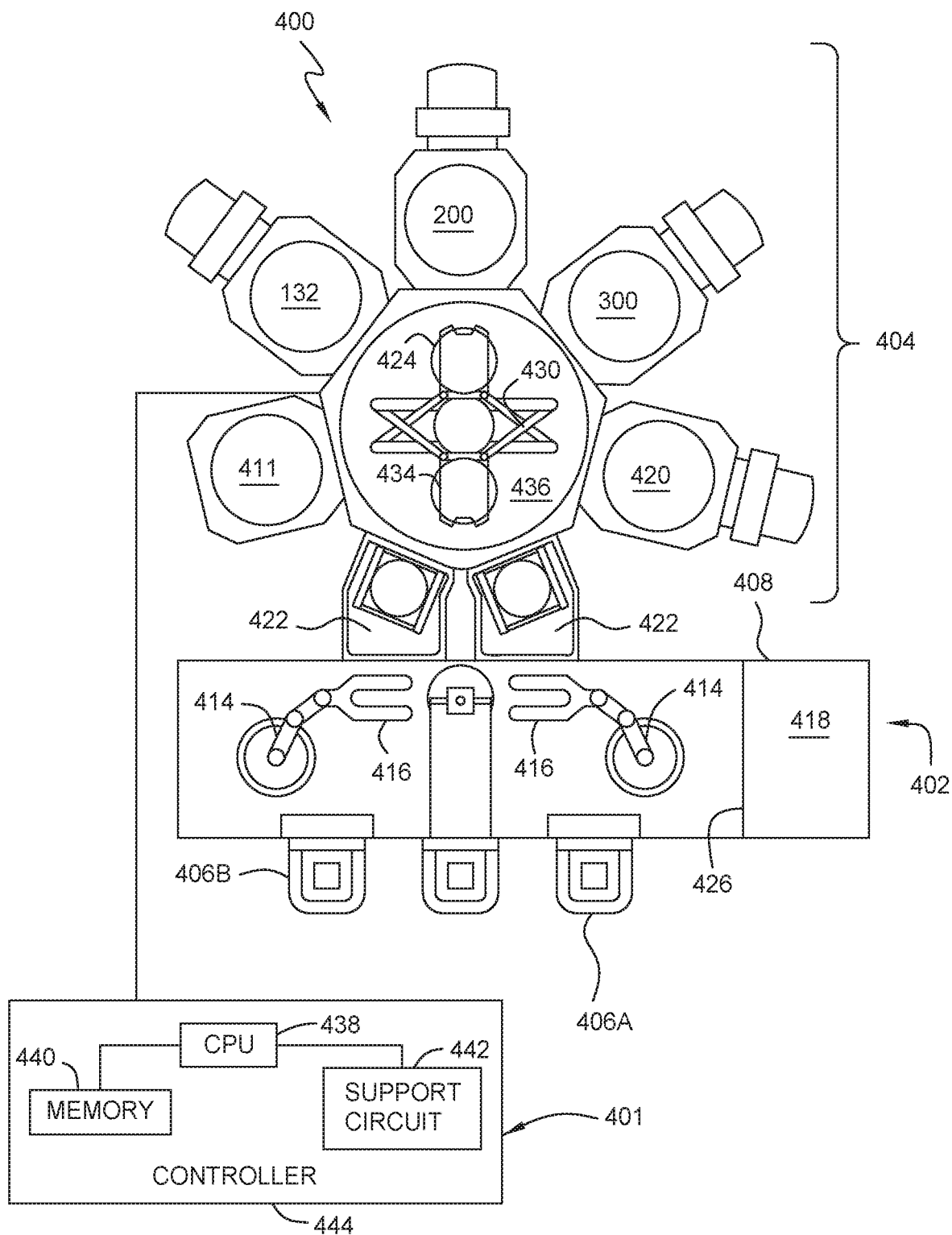
FIG. 4 depicts one embodiment of a cluster processing system for practice one embodiment of the present disclosure.

FIG. 4 is a schematic, top plan view of an exemplary cluster processing system 400 that includes one or more of the processing chambers 132, 200, 300, 420, 411 that are incorporated and integrated therein. In one embodiment, the cluster processing system 400 may be a CENTURA® or ENDURA® integrated processing system, commercially available from Applied Materials, Inc., located in Santa Clara, Calif. It is contemplated that other processing systems (including those from other manufacturers) may be adapted to benefit from the disclosure.

The cluster processing system 400 includes a vacuum-tight processing platform 404, a factory interface 402, and a system controller 444. The platform 404 includes a plurality of processing chambers 132, 200, 300, 420, 411 and at least one load-lock chamber 422 that is coupled to a vacuum substrate transfer chamber 436. Two load lock chambers 422 are shown in FIG. 4. The factory interface 402 is coupled to the transfer chamber 436 by the load lock chambers 422.

In one embodiment, at least one of the processing chambers, such as the chamber 411, is a cooling chamber, a pre-cleaning chamber, or other suitable chambers. In the example depicted in FIG. 4, the chamber 411 is a pre-cleaning chamber. The chamber 411 may assist removing surface residuals, surface native oxides from the substrate surface. Different gases may be supplied into the chamber 411 for different purposes. For example, a cleaning gas may be supplied when a cleaning process is desired to perform on the substrate surface. Alternatively, when a thin surface passivation layer is desired, a passivation gas mixture may be supplied that allows the substrate to be soaked and/or immersed under the environment containing the passivation gas mixture. As a result, the thin surface passivation layer may be formed on the substrate by absorption of atoms sourced from the passivation gas mixture. Other different types of the gas mixtures may be supplied in the chamber 411 to provide different surface reaction to the substrate.

In one embodiment, the factory interface 402 comprises at least one docking station 408 and at least one factory interface robot 414 to facilitate transfer of substrates. The docking station 408 is configured to accept one or more front opening unified pod (FOUP). Two FOUPS 406A-B are shown in the embodiment of FIG. 4. The factory interface robot 414 having a blade 416 disposed on one end of the robot 414 is configured to transfer the substrate from the factory interface 402 to the processing platform 404 for processing through the load lock chambers 422. Optionally, one or more metrology stations 418 may be connected to a terminal 426 of the factory interface 402 to facilitate measurement of the substrate from the FOUPS 406A-B.

Each of the load lock chambers 422 have a first port coupled to the factory interface 402 and a second port coupled to the transfer chamber 436. The load lock chambers 422 are coupled to a pressure control system (not shown) which pumps down and vents the load lock chambers 422 to facilitate passing the substrate between the vacuum environment of the transfer chamber 436 and the substantially ambient (e.g., atmospheric) environment of the factory interface 402.

The transfer chamber 436 has a vacuum robot 430 disposed therein. The vacuum robot 430 has a blade 434 capable of transferring substrates 424 among the load lock chambers 422, the metrology system 410 and the processing chambers 132, 200, 300, 420, 411.

In one embodiment of the cluster processing system 400, the cluster processing system 400 may include one or more processing chambers 132, 200, 300, 420, 411, which may be a deposition chamber (e.g., physical vapor deposition chamber, chemical vapor deposition, or other deposition chambers), annealing chamber (e.g., high pressure annealing chamber, RTP chamber, laser anneal chamber), a cooling chamber or a treatment chamber that can heat or cool the substrate, etch chamber, orientation chamber that can rotate the substrate, a cleaning chamber, curing chamber, lithographic exposure chamber, or other similar type of semiconductor processing chambers. In some embodiments of the cluster processing system 400, one or more of processing chambers 132, 200, 300, 420, 411, the transfer chamber 436, the factory interface 402 and/or at least one of the load lock chambers 422. In one example, the processing chambers 132, 200, 300, 420, 411 in the cluster processing system 400 comprises at least one physical vapor deposition chamber, such as deposition chamber 300, a chemical vapor deposition process chamber, such as deposition chamber 132, and an etching chamber, such as the etching chamber 200, and one pre-cleaning and/or cooling chamber, such as the cooling chamber 411.

The system controller 444 is coupled to the cluster processing system 400. The system controller 444, which may include the computing device 401 or be included within the computing device 401, controls the operation of the cluster processing system 400 using a direct control of the process chambers 132, 200, 300, 420, 411 of the cluster processing system 400. Alternatively, the system controller 444 may control the computers (or controllers) associated with the process chambers 132, 200, 300, 420, 411 and the cluster processing system 400. In operation, the system controller 444 also enables data collection and feedback from the respective chambers to optimize performance of the cluster processing system 400.

The system controller 444, much like the computing device 401 described above, generally includes a central processing unit (CPU) 438, a memory 440, and support circuits 442. The CPU 438 may be one of any form of a general purpose computer processor that can be used in an industrial setting. The support circuits 442 are conventionally coupled to the CPU 438 and may comprise cache, clock circuits, input/output subsystems, power supplies, and the like. The software routines transform the CPU 438 into a specific purpose computer (controller) 444. The software routines may also be stored and/or executed by a second controller (not shown) that is located remotely from the cluster processing system 400.

Figure 5:
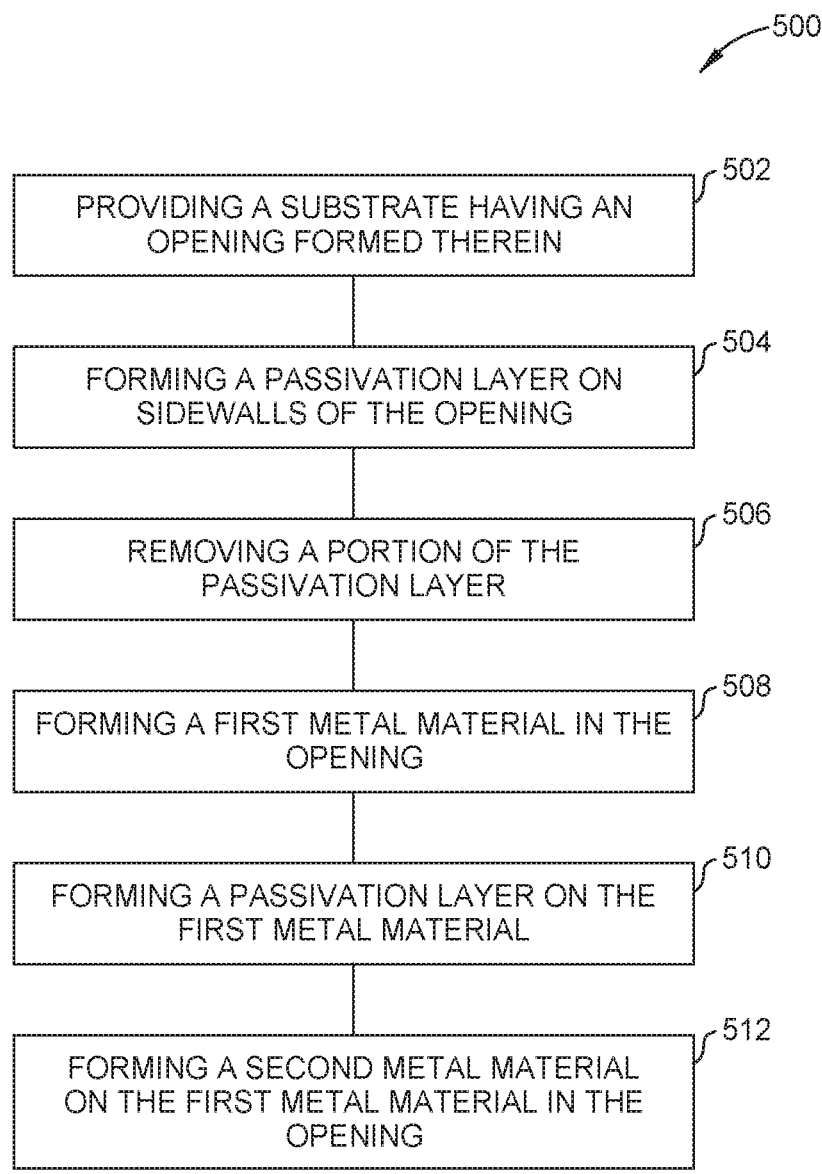
FIG. 5 depicts a flow diagram illustrating a method for fabricating an interconnection structure according to one embodiment of the present disclosure.

FIG. 5 illustrates a process sequence 500 for forming an interconnection structure 600 with different conductive materials selectively formed at different locations of the interconnection structure 600. The sequence described in FIG. 5 corresponds to different fabrication stages depicted in FIGS. 6A-6F, which illustrates schematic cross-sectional views of a substrate 602 having the dual damascene structure 600.

Figure 6A:
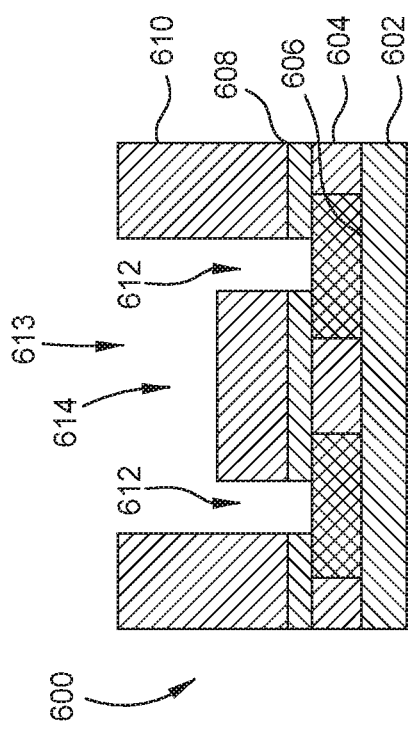
FIGS. 6A-6F are cross sectional views of a substrate with the interconnection structure fabricated from the method of FIG. 5.

The process sequence 500 starts at operation 502 by providing a substrate 602 having an interconnection structure 600 formed therein, as shown in FIG. 6A. The substrate 602 may have a substantially planar surface, an uneven surface, or a substantially planar surface having a structure formed thereon. The substrate 602 shown in FIG. 6A includes a dual damascene structure 600 formed on the substrate 602. In one embodiment, the substrate 602 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 602 may have various dimensions, such as 200 mm, 300 mm or 450 mm diameter wafers, as well as, rectangular or square panels. Unless otherwise noted, embodiments and examples described herein are conducted on substrates with a 300 mm diameter or a 450 mm diameter.

In one embodiment, the dual damascene structure 600 is an interconnection structure utilized in the back end semiconductor process. The dual damascene structure 600 includes a dielectric barrier layer 608 disposed on the substrate 602. A bulk dielectric insulating layer 610, as shown in FIG. 6A, is disposed on the substrate 602 having an opening 613 formed therein configured to have at least one conductive layer (or one or more) disposed therein laterally bounded by the bulk dielectric insulating layer 610. The bulk dielectric insulating layer 610 disposed over the dielectric barrier layer 608. The opening 613 may include a trench 614 formed on a via 612 in the bulk dielectric insulating layer 610. In one embodiment, the bulk dielectric insulating layer 610 is a dielectric material having a dielectric constant less than 4.0 (e.g., a low-k material). Examples of suitable materials include carbon-containing silicon oxides (SiOC), such as BLACK DIAMOND® dielectric material available from Applied Materials, Inc., and other low-k polymers, such as polyamides. In the embodiment depicted in FIGS. 6A-6F, the bulk dielectric insulating layer 610 is a carbon-containing silicon oxide (SiOC) layer.

The dielectric barrier layer 608 has a dielectric constant of about 5.5 or less. In one embodiment, the dielectric barrier layer 608 is a carbon containing silicon layer (SiC), a nitrogen doped carbon containing silicon layer (SiCN), or the like. In the embodiment depicted in FIG. 6A, the dielectric barrier layer is a SiCN film. An example of the dielectric barrier layer material is BLOK® dielectric material, available from Applied Materials, Inc.

In the embodiment depicted in FIG. 6A, the bulk dielectric insulating layer 610 is etched through the opening 613, defining the trench 614 on the via 612 or vice versa, in the bulk dielectric insulating layer 610 over the dielectric barrier layer 608. A portion of the bulk dielectric insulating layer 610 is removed to expose a surface 621 of an underlying conductive material 606 bound by an underlying dielectric structure 604. The underlying conductive material 606 present in the underlying dielectric structure 604 is below the via 612 formed in the dielectric barrier layer 608.

Figure 6B:
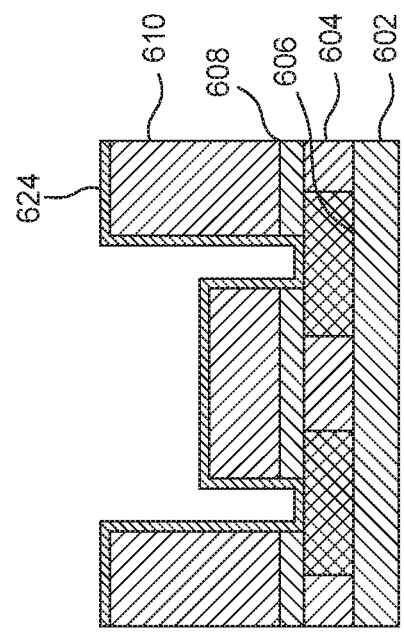

At operation 504, a passivation layer deposition process is performed to form a passivation layer 624 on the exposed surface of the substrate 202, as shown in FIG. 6B. The passivation layer deposition process at operation 504 is performed by transferring the substrate 602 into a chemical vapor deposition chamber, such as the deposition chamber 100 depicted in FIG. 1, an atomic layer deposition chamber, a thermal soaking chamber, such as the chamber 411 depicted in FIG. 4, or other suitable chamber, which can form the passivation layer 624 on the substrate 602. In one example, the passivation layer 624 is formed in the deposition chamber 100 of FIG. 1. The passivation layer deposition process may be formed by supplying a deposition gas mixture into the processing chamber 100 into the surface of the substrate 602 to form the passivation layer 624 over the substrate 602. The passivation layer 624 is formed on across the surface of the substrate 602, as shown in FIG. 6B. The passivation layer 624 may be a dielectric layer that can provide a surface protection to the materials covered thereunder. In one embodiment, the passivation layer 624 is a silicon containing layer, a nitrogen containing layer, an oxygen containing layer, a carbon containing layer, a methyl group containing layer or the like. The passivation layer 624 may be formed by a nitridation process, oxidation process, or by a methylation process as needed.

In one example, the deposition gas mixture includes at least one of a silicon containing gas, a nitrogen containing gas, an oxygen containing gas or a hydrocarbon containing gas to form a dielectric layer as the passivation layer 624. In one example, the passivation layer 624 is a silicon oxide layer ($SiO_2$) when the deposition gas mixture includes a silicon containing gas and an oxygen containing gas. In another embodiment, the passivation layer 624 is a silicon nitride layer (SiN) when the deposition gas mixture includes a silicon containing gas and an nitrogen containing gas. In yet another embodiment, the passivation layer 624 is a polymer containing layer or a methyl group containing layer (such as a hydrocarbon containing material) when the deposition gas mixture includes a hydrocarbon containing gas and the like. Suitable examples of the hydrocarbon containing gas generally have a formula $C_xH_y$, wherein x and y are integers from 1 to 20. Suitable examples of the hydrocarbon containing gas include $CH_4$, $C_2H_4$, $C_2H_6$, $C_3H_8$, $C_3H_6$, $C_4H_8$, $C_4H_{10}$ and the like. Suitable examples of the halogen containing gas include $C_4F_6$, $CF_4$, $C_2F_4$, $C_2F_6$, $C_3F_8$, $C_3F_6$, $CHF_3$, $SiCl_4$ and the like. In some examples, an inert gas, such as He or Ar, can also be added to the deposition gas mixture as needed.

Figure 6C:
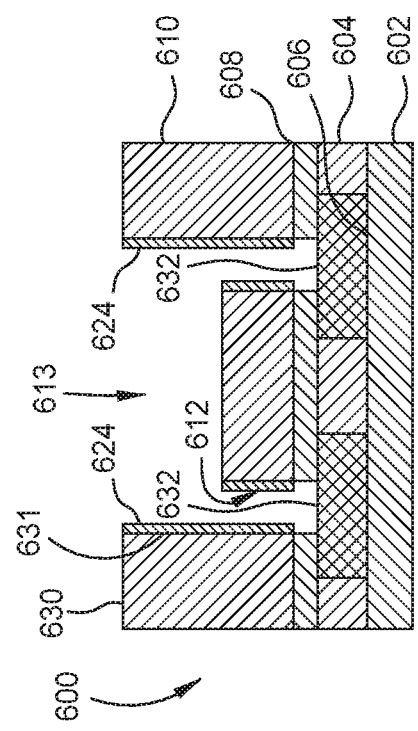

At operation 506, an etching process is performed to remove a portion of the passivation layer 624 from the substrate, as shown in FIG. 6C. The etching process is performed to selectively remove a portion of the passivation layer 624 located on top surfaces 630, 632 of the bulk dielectric insulating layer 610 and the underlying conductive material 606. Accordingly, after the portion of the passivation layer 624 is removed, the underlying conductive material 606 is exposed and ready to allow a conductive material formed thereon for forming the interconnection structure.

The etching process is an anisotropic etching process that can predominately remove the portion of the passivation layer 624 on the top surfaces 630, 632 of the bulk dielectric insulating layer 610 and the underlying conductive material 606 with minimum damage to the passivation layer 624 located on the sidewalls 631 of the bulk dielectric insulating layer 610.

In one example, the etching process is performed by supplying a first etching gas mixture. The etching gas mixture may include a halogen containing gas. Suitable examples of the halogen containing gas include $NF_3$, HF, $CF_4$, $CHF_3$, HBr, $Cl_2$, HCl, HBr, $CF_4$, and the like. In one particular example, the halogen containing gas supplied in the etching gas mixture is $CF_4$.

During the etching process, several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while performing the flash etching process. The RF source and the RF bias power may be applied to the processing chamber in continuous mode or in pulsed mode. In one example, the RF bias power is applied while supplying the first etching gas mixture but not applied while supplying the oxygen containing gas. The RF bias power assists forming the reactive etchants with desired directionality in order to travel down to the top surface 632 of the underlying conductive material 606 to predominately remove the passivation layer 624 located on the top surfaces 630, 632 of the bulk dielectric insulating layer 610 and the underlying conductive material 606. In one example, the RF source power at a frequency of about 13 MHz is applied to maintain a plasma in the etching gas mixture. For example, a RF source power of about 20 Watts to about 1000 Watts is applied to maintain a plasma inside the processing chamber 100. A RF bias power of about 100 Watts to about 300 Watts is applied while supplying the first etching gas mixture, but not the during the supply of the oxygen containing gas.

The etching gas mixture may be flowed into the chamber at a rate of between about 5 sccm to about 900 sccm. A substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

Figure 6D:
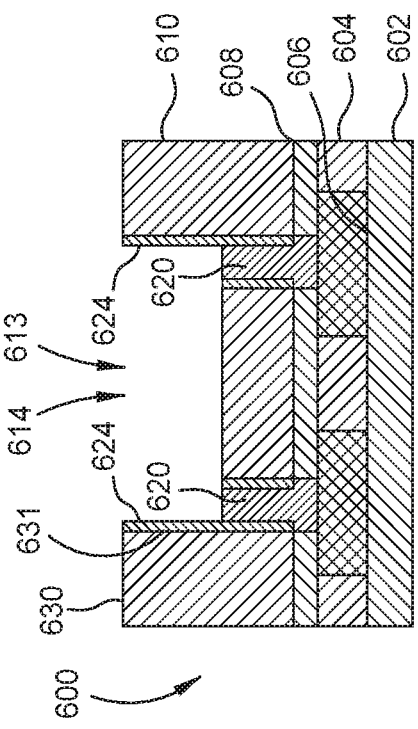

At operation 508, a first metal containing material deposition process is performed to form a first metal containing material 620 in the via 612, as shown in FIG. 6D. The first metal containing material 620 may be formed by suitable deposition process, such as ALD, CVD, PVD or the like. In one embodiment, the first metal containing material 620 is formed by an ALD process. The first metal containing material 620 is selectively formed on the surface 632 of the underlying conductive material 606, filling the via 612 formed in the opening 613.

During the deposition of the first metal containing material 620, a pulse of a reacting gas precursor is supplied onto the substrate surface in a processing chamber to form a monolayer selectively on the surface 632 of the underlying conductive material 606, as shown in FIG. 6D, filling within the via 612 formed in the opening 613. The monolayer may be a part of the first metal containing material 620 eventually filling the via 612. The monolayer is selected to predominantly form the surface 632 of the underlying conductive material 606 with compatible film qualities and characteristics to the underlying conductive material 606, so that the monolayer 508a may be selectively formed on the surface 632 of the underlying conductive material 606, rather than globally formed across the substrate 602, including the surfaces 630 of the bulk dielectric insulating layer 610.

The atomic layer deposition (ALD) process as performed for sequence 500 is a chemical vapor deposition (CVD) process with self-terminating/limiting growth. The ALD process yields a thickness of only a few angstroms or in a monolayer level. The ALD process is controlled by distribution of a chemical reaction into two separate half reactions which are repeated in cycles. The thickness of the metal containing material formed by the ALD process depends on the number of the reaction cycles. As the ALD process is very sensitive to the substrate conditions, the monolayers that forms on surface 632 of the underlying conductive material 606 where the interconnection structure 600 (e.g., metal material) is located may not be able to adhere or form on the insulating material, such as the surfaces 630 of the bulk dielectric insulating layer 610. Thus, by utilizing the differences of the material properties at different locations from the substrate, a selective ALD deposition process may be enabled that allows the precursors from the ALD deposition process to nucleate and grow on the nucleate sites provided from the metal materials from the underlying conductive material 606, while inert to the surfaces 630 from insulating material from the bulk dielectric insulating layer 610.

In one example, the first gas precursor is a metal containing precursor, which is utilized to provide metal elements to form the first metal containing material 620 on the substrate 602. The metal elements sourced from the gas precursor is selected to be easily absorbed and attached to the metal elements from the underlying conductive material 606 from the substrate 602.

During the ALD deposition process, a pulse of a gas precursor (e.g., a reactant) is supplied into the processing chamber followed by a purge gas. In one example, the gas precursor (e.g., the reactant) utilized in the pulse of reaction to form the monolayer includes metal containing gas precursor, such as a tungsten (W) containing gas precursor. Suitable examples of the tungsten (W) containing gas precursor include $WCl_6$, $WF_6$, $W_2(NMe_2)_6$, hexacarbonyl tungsten $(W(CO)_6)$, $(C_6H_6)W(CO)_3$ and the like. Strong adherence of atoms in each layers and absorbability of the layers of atoms onto the surface of substrate provide compact and secured bonding structures so as to render a film property with a high film density and high selectivity (compared to a chemical vapor deposition process). The deposition process is performed by continuously pulsing the precursor to the substrate surface to form the first metal containing material 620 in the via 612 until the via 612 is filled (e.g., having a surface 635 substantially coplanar with a surface 637 of the bulk dielectric insulating layer 610 in the opening 613.

Figure 6F:
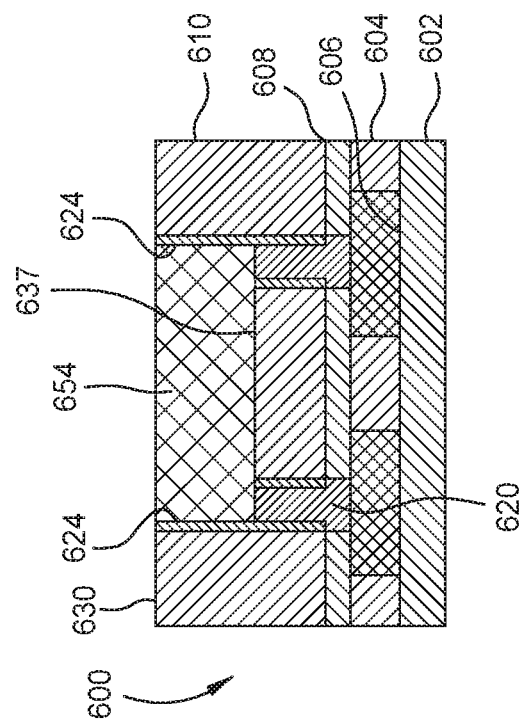
Figure 6E:
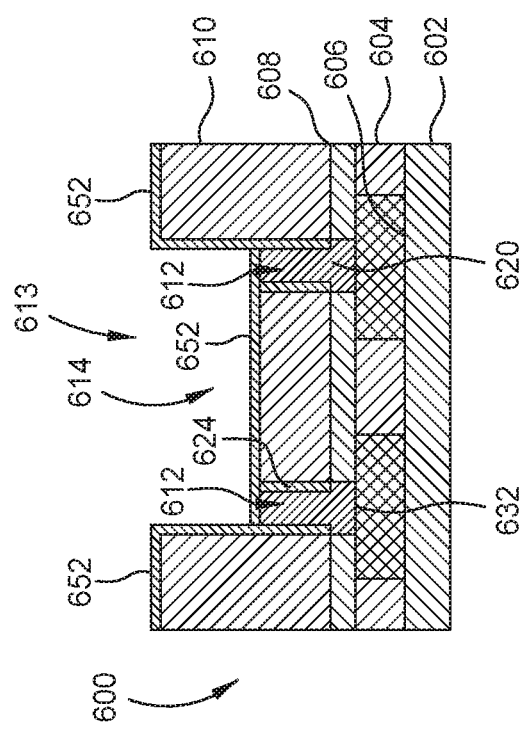

At operation 510, optionally, an additional passivation layer 652 may be optionally formed on the substrate 602, as shown in FIG. 6E. During a semiconductor manufacturing process, a surface of the metal material formed in the bulk dielectric insulating materials is often exposed to air, such as after the manufacture process of operation 508. Prior to the subsequent metallization process to form a device structure on the exposed metal, the substrate may be transferred among different vacuum environments to perform a different processing steps. During transfer, the substrate may have to reside outside the process chamber or controlled environment for a period of time called the queue time (Q-time). During the Q-time, the substrate is exposed to ambient environmental conditions that include oxygen and water at atmospheric pressure and room temperature. As a result, the substrate subjected to oxidizing conditions in the ambient environment may accumulate native oxides or contaminants on the metal surface prior to the subsequent metallization process or interconnection fabrication process.

Thus, the optional operation 510 may provide the additional passivation layer 652 as needed prior to the metallization process at operation 512 so as to provide a wider process window of the Q-time. The additional passivation layer 652 may protect the surface of the first metal containing material 620 from oxidation or exposed to the ambient environment, thus reducing likelihood of surface contamination or oxidation. When the metallization at operation 512 is performed within the Q-time after the first metal containing material deposition process at operation 508, the operation 510 of forming the additional passivation layer 652 may be eliminated.

In one example, the additional passivation layer 652 is similar to or the same as the passivation layer 624 formed at operation 504. The additional passivation layer 652 may be an oxidation layer, a nitridation layer, or a methylation layer as needed.

Prior to the metallization process at operation 512, a portion of the additional passivation layer 652 may be removed, as shown in FIG. 6F, to expose the first metal containing material 620 in the via 612 so as to allow the metallization process to be performed thereon to complete the interconnection structure 600.

At operation 512, a metallization process is performed to form a second metal containing material 654 in the trenches 614 in the opening 613 to complete the interconnection structure 600, as shown in FIG. 6F. In the example wherein the second metal containing material 654 is formed from a material the same as the first metal containing material 620, the interconnection structure 600 may also be referred as a dual damascene structure. In contrast, in the example wherein the second metal containing material 654 is formed from a material not the same as the first metal containing material 620, the interconnection structure 600 may also be referred as a single damascene structure. In the example depicted in FIG. 6F, the second metal containing material 654 is selected to have a different metal material from the first metal containing material 620 so that the interconnection structure 600 may be referred as a single damascene structure as needed.

In one example, the second metal containing material 654 may be a copper containing material, cobalt containing material, aluminum containing material, or a Ru containing material formed by a PVD, CVD, ALD, ECP, or other suitable deposition process. In one example, the second metal containing material 654 is a copper containing material when the first metal containing material 620 is a tungsten containing material.

In one example, the second metal containing material 654 is formed from a PVD process performed in a PVD chamber, such as the chamber 300 depicted in FIG. 3. It is noted that additional layers, such as barrier layers or liner layers (e.g., TaN/TiN or Co/Ru) may be formed prior to the second metal containing material 654. The second metal containing material deposition process may be performed by supplying a deposition gas mixture to the chamber 300 for processing, a voltage power is supplied to the sputtering source 314 (e.g., target) to sputter material that forms the second metal containing material 654. For example, voltage power supplied to a copper target sputters the metal copper source material from the sputtering source 314 in form of copper ions to form the desired copper material as the second metal containing material 654. The bias power applied between the sputtering source 314 and the substrate support pedestal 308 maintains a plasma formed from the gas mixture in the process chamber 300. The ions mainly from the gas mixture in the plasma bombard and sputter off material from the sputtering source 314. The gas mixture and/or other process parameters may be varied during the sputtering deposition process, to form the second metal containing material 654 with desired film properties for different film quality requirements.

During processing, several process parameters may be regulated. In one embodiment, a RF source power may be supplied between about 100 Watts and about 20000 Watts. A RF bias power may be applied to the substrate support between about 50 Watts and about 5000 Watts. The substrate temperature may be maintained between about 150 degrees Celsius and about 450 degrees Celsius.

It is noted that the sequence 500 may be performed in the various chambers incorporated in the cluster system 400 without transferring the substrate out of the cluster system 400 and maintaining the desired vacuum level.

Thus, by utilizing different materials for a selective via filling process (e.g., a W via fill approach) along with a trench metallization process (e.g., a Cu trench approach), a relatively lower via resistance may be obtained, which enhances and promotes integration, electrical performance and reliability requirements. The passivation layer formed prior to the via fill process may enhance the interface protection with minimum damage to the sidewalls of the insulating structure (e.g., low-k dielectrics, oxides, and the like) while maintaining the desired low via resistance.

While the foregoing is directed to embodiments of the present invention, other and further embodiments of the invention may be devised without departing from the basic scope thereof, and the scope thereof is determined by the claims that follow.

What is claimed is:

1. A method of forming an interconnect structure, comprising:
    forming an opening comprising a via and a trench in an insulating structure having a top surface and sidewalls, the insulating structure formed on a substrate;
    forming a first passivation layer in the opening, the first passivation layer formed over the top surface and sidewalls;
    removing a portion of the first passivation layer from the top surface; and
    selectively depositing a first metal containing material in the via, the first metal in contact with first passivation layer.

2. The method of claim 1, further comprising:
    forming a second metal containing material in the trench in contact with the first metal containing material.

3. The method of claim 1, wherein forming the first passivation layer further comprises:
    supplying a gas mixture containing at least one of a silicon containing gas, nitrogen containing gas and a carbon containing gas to form the first passivation layer on the substrate.

4. The method of claim 3, wherein the first passivation layer is a oxide layer, a nitride layer or a methyl group containing layer.

5. The method of claim 1, wherein the first metal containing material is formed by an atomic layer deposition process.

6. The method of claim 2, wherein the first metal containing material is different from the second metal containing material.

7. The method of claim 1, wherein the first metal containing material is selected from a group consisting of Co, W, Ru and Al.

8. The method of claim 2, wherein the second metal containing material is copper.

9. The method of claim 2, wherein the second metal containing material is formed by a physical vapor deposition process.

10. The method of claim 1, wherein removing the portion of the first passivation layer further comprises:
    removing the first passivation layer above an underlying conductive layer formed in the substrate.

11. The method of claim 10, wherein the first metal containing material is formed on and in contact with the underlying conductive layer.

12. A method of forming an interconnect structure, comprising:
    forming an opening comprising a via and a trench in an insulating structure formed on a substrate;
    forming a first passivation layer in the opening;
    removing a portion of the first passivation layer from the opening;
    selectively depositing a first metal containing material in the via; and
    forming a second passivation layer in the opening covering the first metal containing material.

13. The method of claim 12, wherein the first passivation layer and the second passivation layer are formed from the same material.

14. The method of claim 13, wherein removing the portion of the first passivation layer from the opening further comprises:
    leaving the first passivation layer on sidewalls of the opening.

15. The method of claim 12, further comprising:
    removing a portion of the second passivation layer from the opening to expose a surface of the first metal containing material.

16. A method of forming an interconnect structure, comprising:
    forming a first passivation layer in an opening formed in an insulating structure having a top surface and sidewalls, the insulating structure formed on a substrate, the first passivation layer formed over the top surface and sidewalls, wherein the opening comprises a trench formed on a via in the insulating structure, and wherein the first passivation layer is an oxide layer, a nitride layer or a methyl group containing layer;
    selectively depositing a first metal containing material in the via, the first metal in contact with first passivation layer; and
    forming a second metal containing material in the trench in contact with the first metal containing material.

17. The method of claim 16, wherein the first metal containing material is different from the second metal containing material.

18. The method of claim 16, wherein the first metal containing material is selected from a group consisting of Co, W, Ru and Al.

19. The method of claim 16, wherein the second metal containing material is copper.

20. An interconnect structure comprising:
    an insulating structure comprising a top surface and sidewalls, the insulating structure formed on a substrate having an opening comprising a via and a trench formed therein;
    a passivation layer formed on a sidewall of the insulating structure, wherein the passivation layer is an oxide layer, a nitride layer or a methyl group containing layer;
    a first metal containing material formed in the via, the first metal in contact with first passivation layer; and a second metal containing material formed in the trench, wherein the first metal containing material is different from the second metal containing material.

* * * * *